PULSE GENERATOR

Filed Dec. 31, 1963 2 Sheets-Sheet 1

INVENTOR.
John C. Hubbs
BY Flehr & Swain
ATTORNEYS

PULSE GENERATOR

Filed Dec. 31, 1963

2 Sheets-Sheet 2

INVENTOR.
John C. Hubbs
BY Flehr & Swain
ATTORNEYS 3,309,540
PULSE GENERATOR
John C. Hubbs, Lafayette, Calif., assignor to E-H Research Laboratories, Inc., Oakland, Calif., a corporation of California
Filed Dec. 31, 1963, Ser. No. 334,855
5 Claims. (Cl. 307—106)

Figure 1:
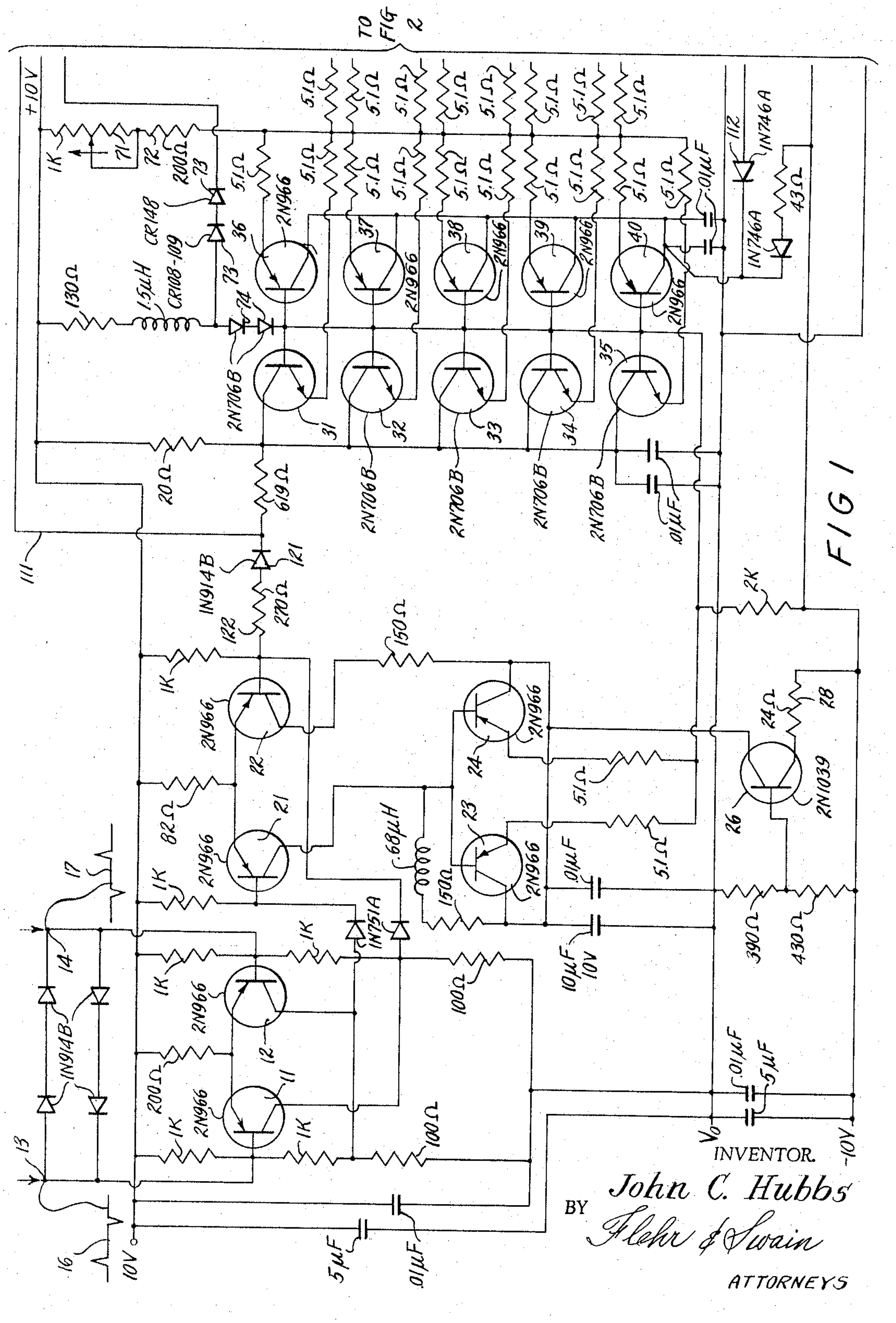

This invention relates generally to pulse generators.

It is an object of the present invention to provide a pulse generator for generating pulses of fast rise time, high current, either polarity.

It is another object of the present invention to provide a pulse generator in which the output pulses of either polarity are generated by the same active elements.

It is a further object of the present invention to provide a pulse generator which is simple and economical in construction.

It is still another object of the present invention to provide a high power pulse generator including means for rapidly responding to overload to prevent damage of the circuit elements.

The foregoing and other objects of the invention will become more clearly apparent from the following description taken in conjunction with the accompanying drawing.

Figure 2:
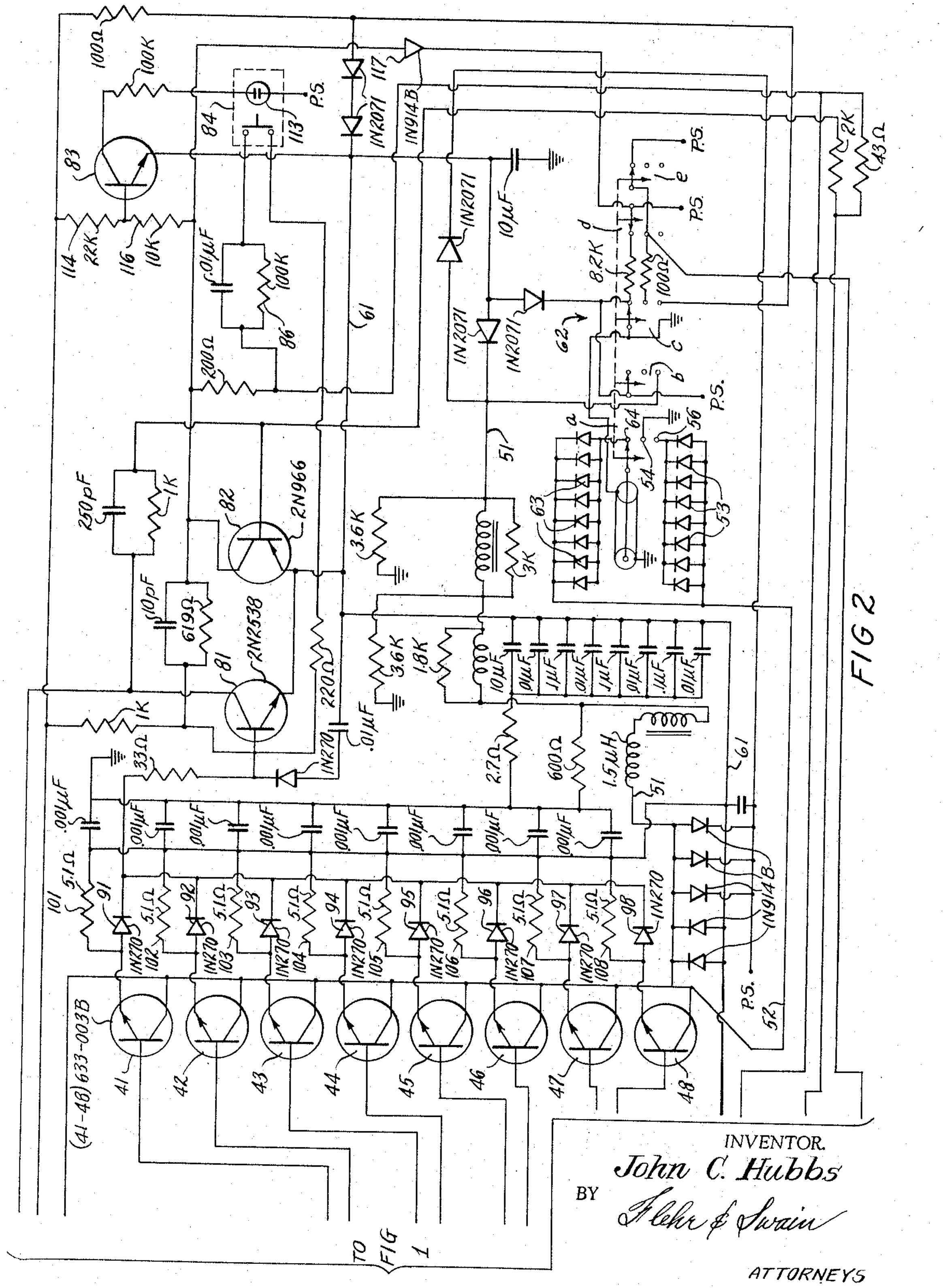

Referring to the drawing:

FIGURE 1 is a schematic circuit diagram of one portion of the pulse generator; and FIGURE 2 is a schematic circuit diagram of another portion of the pulse generator.

Referring to FIGURE 1, the transistors 11 and 12 and associated circuit components form a bistable multivibrator. The bistable multivibrator is responsive to pulses applied to the terminals 13 and 14, schematically illustrated as pulses 16 and 17, to flip from one state with the application of the first of the pair of pulses and revert to its original state upon the application of the second of the pair of pulses. The output pulse width is determined by the timing between each of the pair of pulses 16 and 17.

A pulse output occurs when the base of the transistor 11 receives the positive pulse 16 and the base of the transistor receives the sharp negative pulse 17. These pulses cause the bistable multivibrator to flip states. The potential on the collector of the transistor 12 goes positive causing the transistor 21 to cut off.

The transistors 21 and 22 are connected as amplifiers. The transistor 21 is normally on, while the transistor 22 is normally cut off by the output from the bistable multivibrator.

The transistor 11 is normally on, causing its collector voltage to be more positive than the collector voltage of the transistor 12. The transistor 21 is normally on and the transistor 22 is normally off because: (1) the base of the transistor 21 is coupled to the collector of the transistor 12; (2) the base of the transistor 22 is coupled to the collector of the transistor 11; and (3) the collector of the transistor 12 is more negative than the collector of the transistor 11 during the steady state.

Transistors 23 and 24 are connected as emitter followers whose base potential is determined by the collector voltage of the transistor 21. Since the transistor 21 is normally on, its collector voltage is positive causing the emitters of the transistors 23 and 24 to be positive. When the transistor 21 is cut off, the emitters of the transistors 23 and 24 go to the negative voltage determined by the emitter follower comprising the transistor 26 through resistor 28. This causes the transistors 36–40 to conduct and the transistors 31–35 to be cut off. If the inputs to the multivibrator comprising the transistors 11 and 12 are reversed, then the normal condition of the elements is opposite to that just described and when a signal is applied to the multivibrator, it causes the transistors 31–35 to conduct and the transistors 36–40 to be cut off. The transistors 31–35 and 36–40 are resistively connected to the base of output transistors 41–48 and serve to provide bias such that the transistors 41–48 are either fully on or fully off depending upon the quiescent or normal operating state of the circuit.

For positive polarity output pulses, the collectors of the transistors 41–48 are connected through line 51 to a current source, P.S., by means of ganged switch 62 which consists of individual switches **62*a*–62*e*. More specifically, switch 62*b* accomplishes this connection when rotated from the position (negative polarity) shown. In the steady state condition, the output transistors are fully on and conducting all the current which is available. None of the current is supplied along the line 52** to the load.

These transistors are turned fully on by the current supplied to their bases by the transistors 31–35. The transistors are switched or controlled by the output from the emitter follower comprising transistor 23 and 24. With an input signal, the emitters of transistors 23 and 24 go to the negative voltage determined by the emitter follower comprising transistor 26, previously described, and the transistors 36–40 conduct and the transistors 31–35 are cut off. This biases off the output transistors 41–48.

With the output transistors 41–48 biased off, all of the current being supplied to the collector flows along the line 52, through diodes 53 to the load connected between the terminals 54 and 56. Upon the occurrence of the second of the triggering pulses, a negative pulse is generated at the base of the transistor 11 and a positive pulse at the base of the transistor 12, and this resets the multivibrator and the output circuitry to the steady state condition in which the current is being shunted through the power transistors 41–48 and no current appears at the output.

For negative output pulses, the biasing of the transistors 41–48 is reversed by ganged switch 62. The voltage on the line 61 is switched by switch **62*e* to a selected negative value and the current supply along the line 51 to the collectors of the transistors 41–48 is decoupled by the switch 62*b*. The inputs to the bistable multivibrator comprising the transistors 11 and 12 is reversed so that quiescent conditions for negative pulse output are just opposite to those for positive pulse output. The output transistors are, therefore, normally cut off. Under the cut-off conditions, the emitters of these transistors are at a negative potential determined by the potential on the line 61. The base of the transistors is held several volts more negative than the emitters and the collectors rest at substantially zero volts. When the output transistors are pulsed on, the collectors go immediately to the emitter voltage (ignoring the saturation current and the small voltage drops across the resistors connected in series therewith). This voltage is coupled by power transistors 41–48 through the diodes 63 to the load terminal 64 providing a negative output pulse between the terminals 54 and 64**.

To obtain fast positive pulse fall time and negative pulse rise time, the transistors 41–48 and 31–35 are driven well into saturation. After the switching has occurred, the drive current to the transistors is reduced to that which is just sufficient to hold them in saturation. This is necessary so that the transistors can be turned off rapidly to provide a fast positive pulse leading edge and negative pulse trailing edge.

The circuitry for reducing the drive current comprises the resistors 71 and 72 and the diodes 73 and 74. In the positive pulse polarity, transistors 41–48 are turned on hard; the collector voltage goes to zero volts. This clamps the voltage of the junction of the diodes 73 and 74 to a slightly positive voltage equal to the voltage drop across the diode 73. Diode 74, in turn, clamps the base of the transistors 31–35 and 36–40 to ground. Since the voltage drop across the two clamped diodes 73 and 74 are approximately equal, the base of the transistors 31–35 and 36–40 are at the same potential as the collector of the transistors 41–48 which is substantially zero volts. Thus, both sets of transistors 31–35 and 36–40 are biased off and all the drive current for the transistors 40–48 is developed through the resistors 71 and 72. The variable resistor is adjusted to provide just sufficient current to hold the transistors 40–48 in saturation.

The pulse generator includes overload circuitry which responds to a predetermined peak output voltage, peak output current, and average and/or peak current through the emitter followers, and if any one of these exceeds a certain maximum value, the circuitry will serve to bias off the amplifier and disconnect the current supplied to the output transistors.

The overload circuitry includes the transistors 81, 82 and 83. The transistors 81 and 82 are connected as a bistable circuit. It is noted that the transistor 81 is an n-p-n transistor, while the transistsor 82 is a p-n-p. Using complementary transistors means that the transistors are either both on or both off. During normal instrument operation, the transistors are both off. They are turned off, if necessary, by pressing an overload reset button 84 which couples the negative potential across the resistor 86 to the base of the transistor 81, turning the transistor off. When the transistor 81 is turned off, the base of the transistor 82 goes positive with respect to the line 61, turning that transistor off.

The diodes 91–98 connected in the emitter circuit of each of the power transistors 41–48, respectively, will conduct positive current to the base of the transistor 81 under certain conditions and switch the transistor. It is to be noted that each of the output transistors can independently cause the switching. These diodes may, for example, be germanium which requires a forward bias of approximately .4 volt to conduct current. Normally, the voltage at the emitters of the power transistors 41–48 is less than 1.0 volts. However, if for any reason, one of the transistors conducts excessive currents, the voltage developed across the emitter resistors 101–108, respectively, will be greater than .4 volt. The diode will then conduct positive current to the base of the transistor 81 and serve to switch the multivibrator.

The collectors of the transistors 31–35 are connected to the multivibrator along the line 11. If the total current through these transistors becomes too large, the bias of the base of the transistor 82 will change sufficiently to turn on the transistor 82 and cause the multivibrator to change states.

Similarly, the collectors of the transistors 36–40 are coupled through a diode 112 to the multivibrator. Should these draw more than a predetermined current, the bias on the transistor 81 will change enough to cause the transistor to turn on and force the multivibrator to change states.

When the multivibrator is turned on, the collector of the transistor 81 goes negative and the collector of the transistor 82 goes positive and this initiates the following operations: First, it turns on the overload indicator 113. The transistor 83 is normally held off and there is no potential difference between the light and the resistor 167. The transistor is held off by the negative potential at the base determined by the resistive divider 114, 116 and the negative potential of the collector of the transistor 82. When the transistor 82 is turned off, the collector potential goes positive causing the transistor 83 to turn on. With transistor 83 full on, a relatively high voltage is impressed across the neon indicator and the resistor which is sufficient to cause the indicator 113 to turn on and give an indication of overload conditions.

The positive going step at the collector of the transistor 82 caused by the multivibrator changing states is also coupled to the power supply (not shown) through a diode 117 and act to turn off the high voltage power supply.

The power supply takes several milliseconds to turn off. This may be too slow to fully protect the transistors 41–48 and does not provide protection for the transistors 31–35 or 36–40.

Additional protection is provided by a logic loop which includes the diode 121 and the resistor 122. The diode clamps the base of the transistor 22 so that it can go no more positive than the collector of transistor 81. Normally, transistor 81 is off and the collector voltage is several volts positive. This permits the base of the transistor 22 to go positive and the amplifier comprised of the transistors 21 and 22 behaves normally. When the overload multivibrator is triggered on, the collector of the transistor 81 goes to the voltage of the line 61 which is near zero. This biases the amplifier 22 on by clamping the base of the transistor 22 negative. Since the transistor 22 cannot be turned off, transistor 21 is forced to remain off blocking the pulse train to the emitter followers 23, 24. This logic operates rather instantaneously, 10 nanoseconds or less, which is fast enough to protect all of the transistors in the circuit.

A circuit was constructed as shown in the figures with the component values shown adjacent each of the components in the figures.

In the circuit constructed in accordance with the foregoing, the amplitude of the output pulses was variable from zero to 50 volts, either positive or negative, into a 50 ohm resistance. Pulse top distortion was less than ten percent at all amplitudes greater than 20 volts and typically five percent of maximum amplitude. Rise times of less than 7 nanoseconds for negative pulses and for all positive pulses greater than 20 volts were provided. Fall times were less than 7 nanoseconds for all positive pulses, and for negative pulses greater than 20 volts amplitude.

Thus, it is seen that there is provided a pulse generator suitable for generating pulses of either polarity having fast rise time.

I claim:

1. A pulse generator comprising at least one active element operative in at least two states, a first state wherein it presents a high impedance between two terminals and a second state where it presents a low impedance between the same two terminals, means for conditioning said active element to normally assume said first or said second state, means responsive to input signals of one polarity for switching said element from the first to the second state for a predetermined time when the element is conditioned normally to said first state and for switching said active element from said second state to the first state when the element is conditioned normally to said second state, output means, means connected to said output means and said active element for supplying current thereto when the active element is conditioned normally in its second state, a current source, a voltage source, switching means connected to said output means and said active element and having a first condition for coupling said current source to said active element and for biasing said active element to normally assume its second state, said active element serving to normally direct current away from said output means and to pass current to said output means when it is switched to its first state by said input signals, said switching means having a second condition for coupling said voltage source to said active element and decoupling said current source and for biasing said active element to normally assume its first state and to supply voltage to said output means when it is switched to its second state.

2. A pulse generator comprising a bistable circuit responsive to input signals to form an output pulse of predetermined duration, said circuit forming pulses of a predetermined first polarity for input signals of a first polarity and of a second polarity for input signals of a second polarity, an emitter follower circuit, an amplifier connected to said bistable circuit serving to drive said emitter follower circuit, drive transistors connected to be controlled by the emitter follower, at least one transistor having emitter, base and collector electrodes, said drive transistors serving to bias said transistor normally fully on or normally fully off, said drive transistors being responsive to pulses of first polarity for turning said transistor from its normaly on state to its off state, said drive transistors being responsive to said pulses of second polarity for turning said transistor from its normally off state to its normally on state, means for providing current to said output means and said transistor whereby when said transistor is in its normal conducting state, it shunts said currents and when it is switched to its off state, it serves to pass said current to said load, and means providing a voltage to said transistor and load whereby when the transistor is in its normally off state, it disconnects the load from the voltage supply and in its normally on state, it connects the voltage source to the load.

3. A pulse generator comprising a bistable circuit responsive to input signals to form an output pulse of predetermined duration, said circuit forming pulses of a predetermined first polarity for input signals of a first polarity and of a second polarity for input signals of a second polarity, at least one transistor having emitter, base and collector electrodes, first means for biasing said transistor to be normally fully on, second means for biasing said transistor to be normally fully off, said biasing means being responsive to pulses of said first polarity for turning said transistor from its normally on state to its normally off state, said biasing means being responsive to said pulses of second polarity for turning said transistor from its normally off state to its normally on state, means for providing current to said output means and said transistor whereby when said transistor is in its normal conducting state it shunts said current and when in its off state, it serves to pass said current to said load; means providing a voltage to said transistor and load whereby when the transistor is in its normally off state, it disconnects the load from the voltage supply and in its normally on state, it connects the voltage source to said load, and overload circuit comprising a bistable circuit normally operating in a first state, means responsive to excessive currents in said transistor and in said biasing means serving to develop a signal to switch said bistable circuit to its second state, means responsive to switching of said bistable circuit to its second state for turning off the power supplied to said pulse generator, means responsive to switching of said bistable circuit to indicate the overload condition, and means responsive to switching of said bistable circuit inhibiting operation of said biasing means in response to said pulses whereby under overload conditions, the normal state of said transistor cannot be changed.

4. A pulse generator comprising a bistable circuit responsive to input signals to form an output pulse of predetermined duration, said circuit forming pulses of a predetermined first polarity for input signals of a first polarity and of a second polarity for input signals of a second polarity, at least one transistor having emitter, base and collector electrodes, first means for biasing said transistor to be normally fully on, second means for biasing said transistor to be normally fully off, said biasing means being responsive to pulses of said first polarity for turning said transistor from its normally on state to its normally off state, said biasing means being responsive to said pulses of second polarity for turning said transistor from its normally off state to its normally on state, means for providing current to said output means and said transistor whereby when said transistor is in its normal conducting state, it shunts said current and when in its off state, it serves to pass said current to said load, means providing a voltage to said transistor and load whereby when the transistor is in its normally off state, it disconnects the load from the voltage supply and in its normally on state, it connects the voltage source to said load, an overload circuit comprising a bistable circuit normally operating in a first state, means for sensing overload conditions in said pulse generator serving to switch said bistable circuit to its second state, means responsive to switching of said bistable circuit to its second state for turning off the power supplied to said pulse generator, means responsive to switching of said bistable circuit to indicate the overload condition, and means responsive to switching of said bistable circuit inhibiting operation of said biasing means in response to said pulses whereby under overload conditions, the normal state of said transistor cannot be changed.

5. A pulse generator comprising a bistable circuit responsive to input signals to form an output pulse of predetermined duration, said circuit forming pulses of a predetermined first polarity for input signals of a first polarity and of a second polarity for input signals of a second polarity, at least one transistor having emitter, base and collector electrodes, first means for biasing said transistor to be normally fully on, second means for biasing said transistor to be normally fully off, said biasing means being responsive to pulses of said first polarity for turning said transistor from its normally on state to its normally off state, said biasing means being responsive to said pulses of second polarity for turning said transistor from its normally off state to its normally on state, means for providing current to said output means and said transistor whereby when said transistor is in its normal conducting state, it shunts said current and when in its off state, it serves to pass said current to said load, means providing a voltage to said transistor and load whereby when the transistor is in its normally off state, it disconnects the load from the voltage supply and in its normally on state, it connects the voltage source to said load, an overload circuit comprising a bistable circuit normally operating in a first state, means for sensing overload conditions in said pulse generator serving to switch said bistable circuit to its second state, means responsive to switching of said bistable circuit to inhibit operation of said biasing means in response to said pulses whereby under overload conditions, the normal state of said transistor cannot be changed.

References Cited by the Examiner

Basic theory and application of transistors, Department of the Army Technical Manual, T.M. 11–690, March 1959, pages 200 and 203.

MILTON O. HIRSHFIELD, *Primary Examiner.*

J. J. SWARTZ, *Assistant Examiner.*